United States Patent
Shin

(10) Patent No.: US 7,940,821 B2
(45) Date of Patent: May 10, 2011

(54) TEMPERATURE COMPENSATING METHOD OF LASER POWER IN OPTICAL DISK STORAGE APPARATUS

(75) Inventor: Ki Sun Shin, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/324,215

(22) Filed: Jan. 4, 2006

(65) Prior Publication Data

US 2006/0146894 A1    Jul. 6, 2006

(30) Foreign Application Priority Data

Jan. 5, 2005  (KR) ......................... 10-2005-0000898
Jan. 5, 2005  (KR) ......................... 10-2005-0000899
Jan. 10, 2005 (KR) ......................... 10-2005-0002252

(51) Int. Cl.
*H01S 3/13* (2006.01)
(52) U.S. Cl. ................................. 372/29.015
(58) Field of Classification Search ............. 372/29.015
See application file for complete search history.

(56) References Cited

U.S. PATENT DOCUMENTS

| 5,019,769 | A  | * | 5/1991 | Levinson ....................... 372/31 |
| 5,761,230 | A  | * | 6/1998 | Oono et al. ................ 372/38.01 |
| 2002/0087281 | A1 | * | 7/2002 | More ............................ 702/107 |
| 2003/0035451 | A1 | * | 2/2003 | Ishida et al. .............. 372/38.02 |

* cited by examiner

*Primary Examiner* — Minsun Harvey
*Assistant Examiner* — Patrick Stafford
(74) *Attorney, Agent, or Firm* — Birch, Stewart, Kolasch & Birch, LLP

(57) ABSTRACT

A temperature compensating method of laser power in an optical disk storage apparatus is disclosed whereby temperature is compensated so that laser power outputted by a laser diode can be constantly outputted regardless of temperature changes. According to the present invention, a current temperature for operating the laser diode is detected and a linear Equation of a laser power voltage outputted by the laser diode in response to an input current is obtained from the detected current temperature. An input current corresponding to a laser power voltage desired by the obtained linear Equation is calculated and is supplied to the laser diode. Therefore, a laser power desired by the laser diode can be outputted regardless of the temperature changes, thereby enabling to establish an accurate input current.

3 Claims, 6 Drawing Sheets

TEMPERATURE COMPENSATING METHOD OF LASER POWER IN OPTICAL DISK STORAGE APPARATUS

This application claims the benefit of the Korean Application No. 10-2005-0000898 filed on Jan. 5, 2005, Korean Application No. 10-2005-0000899 filed on Jan. 5, 2005, and Korean Application No. 10-2005-0002252 filed on Jan. 10, 2005, which are hereby incorporated by reference.

BACKGROUND OF THE INVENTION

1. Field of the Invention

The present invention relates to a temperature compensating method of laser power in an optical disk storage apparatus. More particularly, the present invention relates to a temperature compensating method of laser power in an optical disk storage apparatus whereby input current supplied to a diode can be compensated in response to temperature changes to thereby enable to output a constant laser power in an optical disk such as a compact disk (CD) or a digital versatile disk (DVD) for recording and reproducing a predetermined information by laser.

2. Description of the Related Art

An optical disk storage apparatus for driving a laser diode provided at optical pickup outputs a laser. The laser outputted by the laser diode is irradiated on a surface of the optical disk such as a CD or a DVD serves to record or reproduce a predetermined data.

In the case that data is recorded on the optical disk by the optical disk storage apparatus, the laser diode is driven to irradiate a very high powered laser on the optical disk. In other words, the optical disk is disposed with a recording layer for storing a predetermined data. The storage of data is made possible by change of physical properties of the recording layer, for the physical properties of the recording layer can be changed by high laser power.

In the case that the data recorded on the optical disk is to be reproduced, data pattern formed in the course of recording the data on the optical disk should not be damaged such that the laser diode is so driven as to output a lower laser power than that of recording the data.

If the laser power is changed in the course of recording the predetermined data on the optical disk, the laser pattern recorded on the optical disk is not constant, such that a decreased recording quality containing lots of errors occurs. The decreased recording quality in turn generates degradation of reproduction performance where stored data is not accurately reproduced.

Another disadvantage is that if the laser power is not constantly maintained even during the predetermined data stored in the optical disk being reproduced, a reproduction signal level of the data is changed to disable the optical disk from reproducing a stable data.

Accordingly, the optical disk storage apparatus is typically disposed therein with an automatic power control (APC) to enable to constantly maintain a laser power outputted from the laser diode.

The APC is generally referred to a technique for controlling an accurate output of laser power desired by a laser diode. The APC can now maintain an accurate and exact laser power by adopting a digital control method from an analogue control method.

In general, the performance of a laser diode may generally be inversely related to the ambient temperature. In other words, the laser power outputted from the laser diode is decreased if the ambient temperature is high while the laser power from the laser diode is increased if the ambient temperature is low.

Consequently, the input current supplied to the laser diode is increased if the ambient temperature is high, and if the ambient temperature is low, the input current supplied to the laser diode is decreased so that laser power outputted from the laser diode should be constantly maintained.

In order to output a laser power desired by a laser diode, the APC should provide an Equation of an input current under a particular temperature, i.e., a normal temperature against a voltage of laser power outputted by the laser diode, and it should be beforehand stored in an optical storage apparatus.

Furthermore, if the laser diode is to be driven, the pre-stored Equation is used to calculate an input current for outputting a voltage of the laser power desired by the laser diode. The calculated input current is then supplied to the laser diode to allow the laser power wanted by the laser diode to be outputted.

As mentioned above, the laser diode is such that the laser power is variable in response to changes of the ambient temperature. However, the APC is pre-stored with an Equation relative to an arbitrary temperature, and calculates an input current of the laser diode for outputting the desired laser power by way of the stored Equation. In other words, no consideration is given to the laser power outputted from the laser diode in response to the changing ambient temperature.

As a result, an input current capable of outputting a laser power wanted by a laser diode relative to a particular temperature corresponding to the Equation can be accurately calculated and can be supplied to the laser diode. However, there is a problem in that, if the ambient temperature of the laser diode changes, it cannot be coped with, and, as a result, an input current capable of outputting a laser power desired by the laser diode cannot be accurately set up in response to the changed ambient temperature.

SUMMARY OF THE INVENTION

It is an object of the present invention to provide a temperature compensating method of laser power in an optical disk storage apparatus configured to accurately calculate an input current capable of outputting a laser power desired by a laser diode from a current temperature for driving the laser diode and to supply the input current to the laser diode.

Another object is to provide a temperature compensating method of laser power in an optical disk storage apparatus configured to adjust an input current of laser diode in response to temperature changes thereby disabling a laser power from being changed even if temperature is changed in the course of driving the laser diode.

Still another object is to provide a temperature compensating method of laser power in an optical disk storage apparatus, whereby a laser diode can output a same laser power as before even if a buffer under-run occurs where a predetermined data is recorded in an optical disk and the recording is again conducted.

In accordance with the object of the present invention, there is provided a temperature compensating method of laser power in an optical disk storage apparatus comprising: obtaining an Equation of input current of laser diode-laser power voltage relative to a current temperature; and calculating an input current of the laser diode based on the Equation and supplying the input current to the laser diode.

The method further comprises a step of a driving command of the laser diode being inputted before the obtaining the Equation wherein the driving command of the laser diode is a recording command or a reproduction command of the optical disk.

The Equation of the input current-laser power voltage relative to the current temperature comprises: obtaining a gradient of the laser power voltage against a temperature relative to a plurality of temperatures in which the laser diode operates, and a linear Equation of a y-intercept of laser power voltage against temperature; obtaining a gradient of laser power voltage relative to the current temperature and the y-intercept by respectively substituting the current temperature for the gradient of the temperature-laser power voltage and the linear Equation of y intercept of the laser power voltage-temperature; and obtaining a linear Equation of the laser power voltage-input current by substituting the gradient of the laser power voltage relative to the current temperature and the y-intercept for the linear Equation.

The step of obtaining the gradient of the laser power voltage-temperature relative to the plurality of temperatures and the linear Equation of y intercept of the laser power voltage-temperature comprises: detecting respective laser power voltages relative to the input current under mutually different plural temperatures; obtaining an Equation of input current under each temperature-laser power voltage by way of the laser power voltage thus detected relative to the input current, and calculating plural gradients and a y-intercept; performing a linear interpolation of the thus-calculated plural gradients and the y-intercept; and obtaining a gradient of laser power voltage-temperature and a linear Equation of y-intercept of the laser power voltage-temperature by way of the linearly interpolated plural gradients thus calculated and the y-intercept.

The linear Equation can be obtained by Formula 1 of y=ax+b, where 'y' denotes a laser power voltage, 'a' denotes a gradient, 'x' denotes an input current and 'b' denotes a y-intercept.

The plural temperatures in which the laser diode operates comprise two temperatures selected within a range of between a minimum temperature range and a maximum temperature range in which the laser diode operates.

The step of obtaining the gradient of the laser power voltage-temperature relative to the plural temperatures, and the linear Equation of y-intercept of the laser power voltage-temperature comprises: detecting a laser power voltage relative to input current under the plural temperatures; obtaining an Equation of laser power voltage—the input current relative to the plural temperatures by way of the input current and the laser power voltage thus detected to calculate plural gradients and y intercept; linearly interpolating the thus-calculated plural gradients and the y intercept; and obtaining a linear Equation of the y-intercept of the laser power voltage-temperature and a gradient of the laser power voltage-temperature.

The linear interpolation of the gradient and the y-intercept is performed by one of Lagrange method, Least Mean Square Method and Newton's Method.

The temperature compensating method of laser power in an optical disk storage apparatus further comprises: detecting whether there has occurred a temperature change following the supply of the input current to the laser diode; obtaining again an Equation of laser power voltage-input current of the laser diode relative to the changed current temperature if it is detected that the current temperature has changed; and calculating an input current of the laser diode by way of the re-obtained Equation and supplying the input current to the laser diode.

A temperature compensating method of laser power in an optical disk storage apparatus comprises: detecting a laser power voltage outputted by a laser diode in response to plural input currents to obtain an Equation of the laser power voltage-input current relative to a current temperature; calculating the input current of the laser diode relative to a predetermined laser power voltage from the Equation of the laser power voltage-input current relative to the current temperature and supplying the input current to the laser diode.

The temperature compensating method of laser power in an optical disk storage apparatus further comprises a driving command of the laser diode being inputted before obtaining the Equation of the laser power voltage-input current relative to the current temperature.

The driving command of the laser diode is either a recording command or a reproduction command of the optical disk.

The Equation of the laser power voltage-input current relative to the current temperature is obtained by detecting a laser power voltage outputted by the laser diode in response to mutually different two input currents.

The Equation of the laser power voltage-input current relative to the current temperature comprises: detecting a laser power voltage outputted by the laser diode in response to mutually different two input currents; substituting the input current and the laser power voltage for a linear Equation to obtain a gradient of laser power voltage-input current relative to the current temperature and a y-intercept; and substituting the gradient and the y-intercept thus obtained for the linear Equation to obtain an Equation of the laser power voltage-input current relative to the current temperature.

The linear Equation can be obtained by Formula 1 of y=ax+b, where 'y' denotes a laser power voltage, 'a' denotes a gradient, 'x' denotes an input current and 'b' denotes a y-intercept.

DETAILED DESCRIPTION OF THE INVENTION

Figure 1:
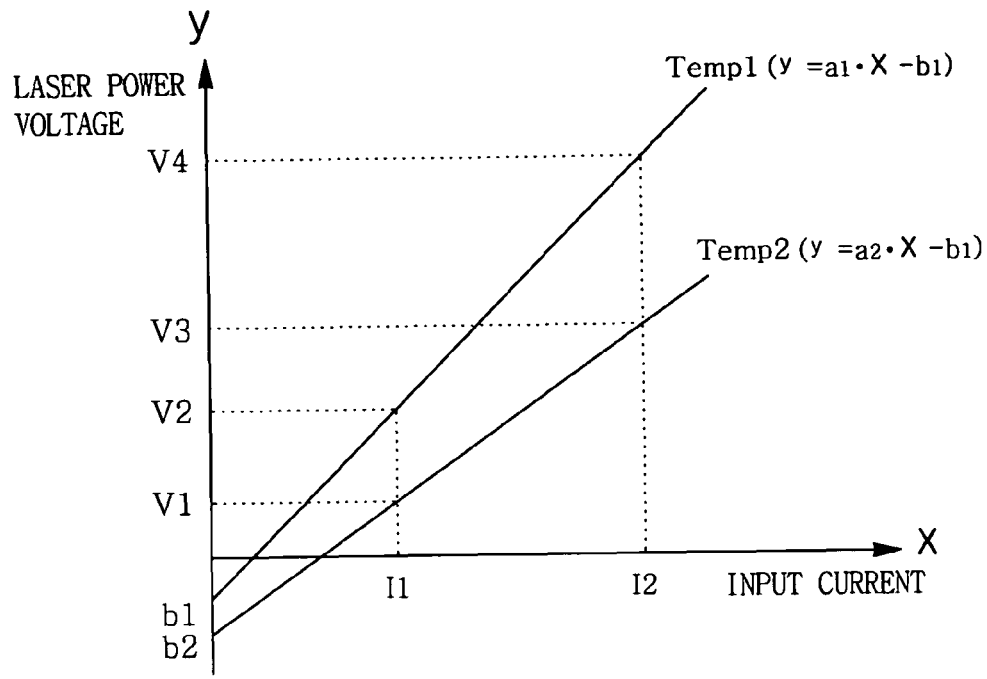
FIG. 1 is a graph illustrating a characteristic of laser power voltage-input current of a laser diode.

FIG. 1 is a graph illustrating a characteristic of laser power voltage-input current of a laser diode, where 'x' axis is an input current supplied to a laser diode and 'y' axis denotes a laser power voltage outputted from the laser diode.

The input current is outputted by a laser diode driving unit in response to control of a controller and supplied to the laser diode.

The laser power voltage is such that a laser outputted by a laser diode in response to the input current is detected by a laser detector and converted to a voltage. The laser detector reflects to a reflector the laser outputted by the laser diode, and receives the laser reflected by the reflector by way of a Front monitor Photo Diode (FPD) to create a current in proportion to a laser power, where the created current is converted to a voltage.

Accordingly, the laser power voltage has a value proportionate to a laser power outputted by the laser diode in response to the input current.

Referring to FIG. 1, laser power voltages V2 and V4 are outputted by the laser diode in case input currents I1 and I2 are supplied at a minimum temperature Temp1. Furthermore, laser power voltages V1 and V3 are outputted by the laser diode in case input currents I1 and I2 are supplied at a maximum temperature Temp2. FIG. 1 is illustrated assuming that the laser power voltage outputted by the laser diode is linearly variable in response to the input current at an arbitrary temperature between the minimum temperature Temp1 and the maximum temperature Temp2.

As a result, it can be noted that the laser power voltage of the laser diode outputted in response to ambient temperature is variable, such that the outputted laser power voltage is decreased as the ambient temperature rises, and is increased as the ambient temperature drops.

Generally, a linear Equation of linear function can be expressed as per Formula 1 of y=ax+b, where 'a' denotes a gradient, 'b' denotes a y-intercept.

It is assumed in FIG. 1 that a gradient and a y-intercept are respectively a1 and b1 at the minimum temperature Temp1, and a gradient and a y-intercept are respectively a2 and b2 at the maximum temperature Temp2. Then, an input current-laser power voltage at the minimum temperature Temp1 and the maximum Temp2 are respectively can be expressed as per the following Formulae 1 and 2.

$$y=a1x-b1 : \text{Temp1} \qquad \text{Formula 2}$$

$$Y=a2x-b2 : \text{Temp2} \qquad \text{Formula 3}$$

Figure 2:
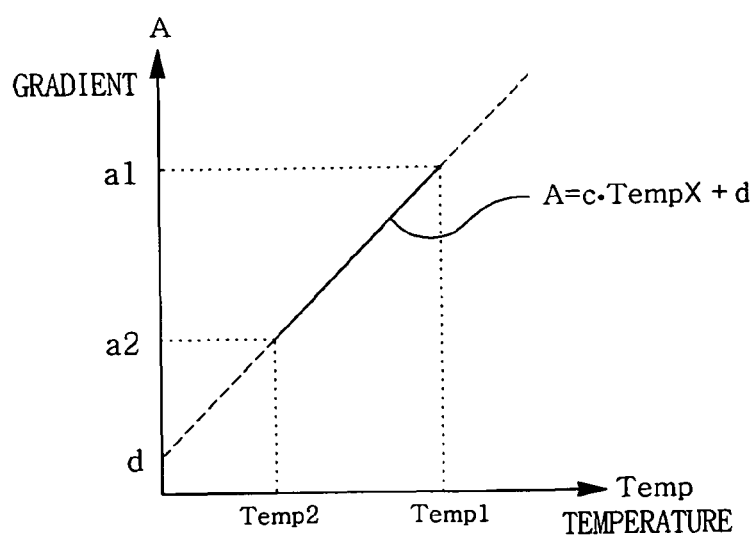
FIG. 2 is a graph illustrating a characteristic of a gradient of laser power voltage—a lower diode temperature.
Figure 3:
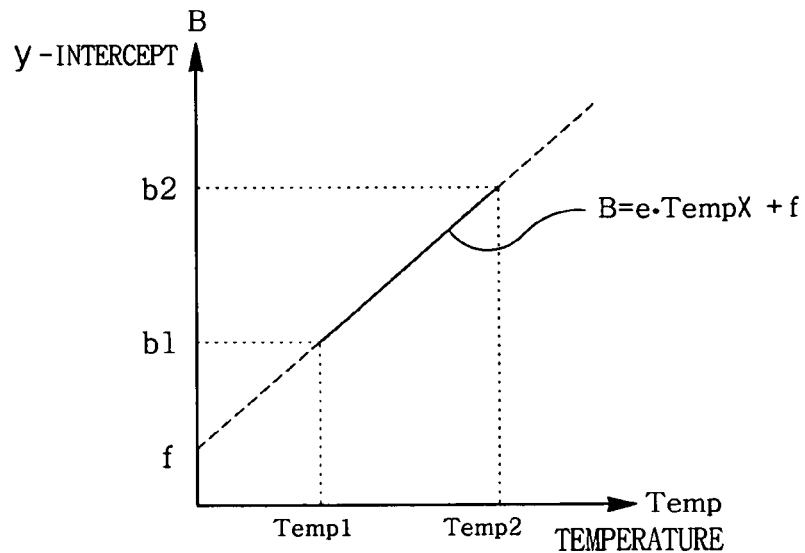
FIG. 3 is a graph illustrating a characteristic of a y-intercept characteristic of laser power voltage-laser diode temperature.

A gradient of temperature-laser power voltage and a y-intercept of temperature-laser power voltage for the laser power voltage outputted by the laser diode at all temperatures in which the laser diode operates can be expressed in graphs as shown in FIGS. 2 and 3.

If the laser diode is operated under all temperatures between the minimum temperature Temp1 and the maximum temperature Temp2, the gradient of the laser power voltage has a value between a1 and a2 in FIG. 2. The y-intercept of the laser power voltage has a valve between b1 and b2 in FIG. 3.

It is assumed that gradients between a1 and a2 have a linear relation relative to temperature changes. Then, a gradient of temperature-laser power voltage outputted by the laser diode relative to all the temperatures in FIG. 2 can be expressed by Formula 4 of A=c TempX+d, where 'c' and 'd' respectively denote a gradient and a y-intercept, and TempX is temperature.

It is assumed that y-intercepts between b1 and b2 of the y-intercept also have a linear relation relative to the temperature changes. Then, y intercept-temperature of the laser power voltage outputted by the laser diode relative to all the temperature in FIG. 3 can be expressed by Formula 5.

$$B=e\text{TempX}+f, \qquad \text{Formula 5}$$

where 'e' and 'f' respectively denote a gradient and a y-intercept, and TempX is temperature.

In the present invention, a linear Equation of the gradient of temperature-laser power voltage of Formula 4 and the gradient of the y-intercept of temperature-laser power voltage of Formula 5 are stored in advance in an optical storage device.

Furthermore, the laser diode is provided at an adjacent location thereof with a temperature sensor to thereby enable to detect an ambient temperature of the laser diode.

Generally, the optical storage apparatus performs a power setting process for prompting APC to output an accurate laser power from the laser diode in case the laser diode is driven to output a laser.

In performing the power setting process in the present invention, a temperature sensor detects an ambient temperature TempX of the laser diode in the first place. The detected ambient temperature TempX is substituted respectively for the linear Equation relative to the gradient of the temperature-laser power voltage of Formula 4 and the linear Equation relative to the y-intercept of the temperature-laser power voltage of Formula 5, where the gradient 'c' and the y-intercept 'd' of Formula 4 and the gradient 'e' and the y-intercept 'f' of Formula 5 are known values.

Figure 4:
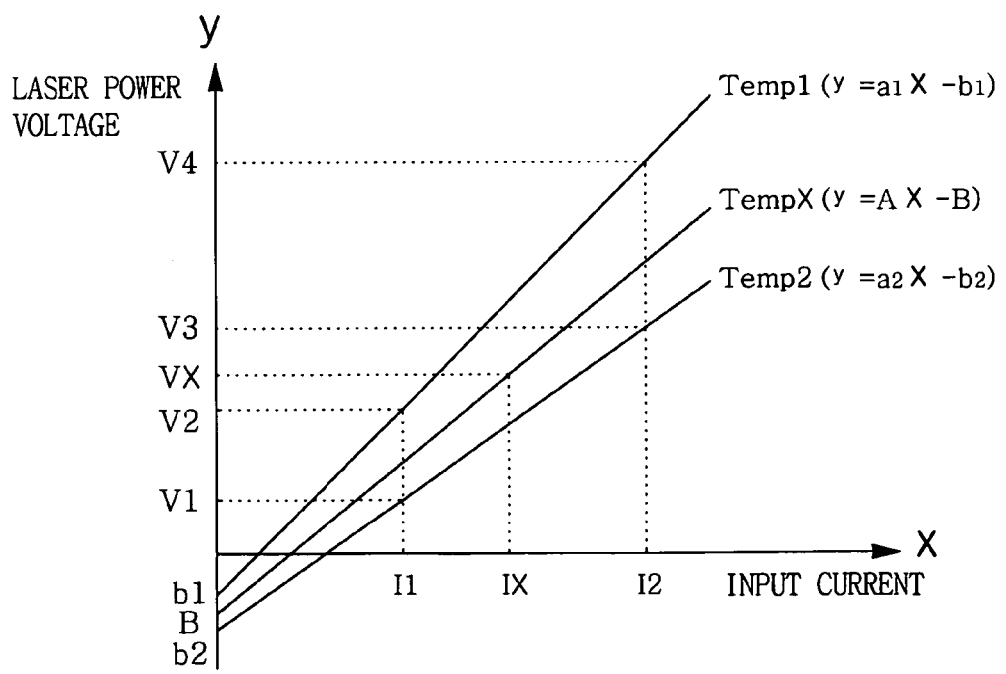
FIG. 4 is a graph illustrating an operation of an embodiment of a temperature compensating method according to the present invention.

Then, a gradient 'A' and a y-intercept 'B' of the laser power voltage outputted by the laser diode relative to the ambient temperature TempX of the detected laser diode can be calculated. The gradient 'A' of the calculated laser power voltage and 'B' of the y-intercept are substituted for Formula 1, and then Formula 6 of linear Equation of the laser power voltage outputted by the laser diode in response to the input current relative to the detected temperature TempX can be obtained as shown in FIG. 4.

$$y=Ax-B : \text{TempX}, \text{ where } a2 \leq A \leq a1, \text{ and } b1 \leq B \leq b2. \qquad \text{Formula 6}$$

Using the Formula 6, an input current relative to all the laser power voltages outputted
by the laser diode is calculated from the current temperature TempX in which the laser diode operates. The laser diode driving unit supplies the calculated input current to the laser diode to output a laser power of level desired by the laser diode.

Figure 5:
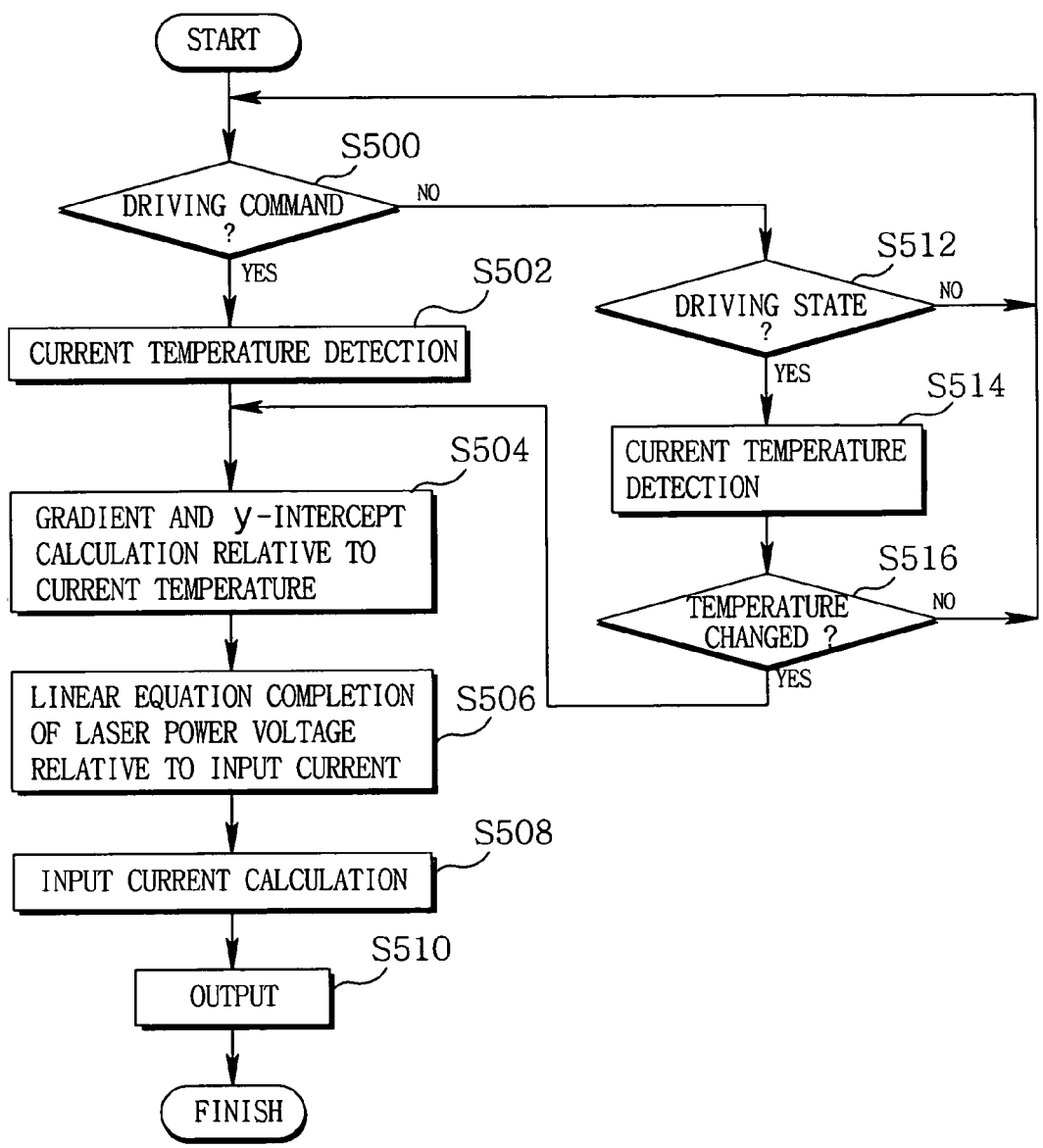
FIG. 5 is a flowchart explaining an operation of an embodiment of a temperature compensating method according to the present invention.

FIG. 5 is a flowchart explaining an operation of an embodiment of a temperature compensating method according to the present invention.

Referring to FIG. 5, an optical storage apparatus discriminates whether a driving command of a laser diode has been inputted (S500). The input of the driving command f the laser diode can be discriminated by whether a recording command or a reproduction command of the laser diode has been inputted.

If the driving command of the laser diode has been inputted, the optical storage apparatus detects the current temperature TempX by way of a temperature sensor disposed near the laser diode (S502). The detected current temperature is substituted for the linear Equations 4 and 5 to calculate a gradient a3 and a y-intercept b3 of the laser power voltage outputted by the laser diode from the detected current temperature (S504).

If the gradient a3 and the y-intercept b3 are calculated, these are substituted for Formula 1 to complete Formula 6 which is a linear Equation of the laser power voltage relative to the input current from the current temperature TempX thus detected.

Henceforth, using Formula 6, an input current (IX) for outputting a voltage (VX) of the desired laser power is calculated (S508), and the calculated input current (IX) is supplied to the laser diode to allow the laser power desired by the laser diode to be outputted (S510).

As described erstwhile, according to the present invention, a linear Equation of the laser power voltage relative to the input current can be accurately calculated from the current temperature TempX, and the input current is determined by the calculated linear Equation and is supplied to the laser diode so that a laser power desired by the laser diode can be accurately outputted.

Meanwhile, if there is no input command at S500, discrimination is made as to whether the current laser diode is driven (S512).

As a result of the discrimination, if it is discriminated that the current laser diode is driven, a current temperature is detected by the temperature sensor (S514), and comparison is made between the currently detected temperature and erstwhile detected temperature, and discrimination is made as to whether there is a temperature change (S516).

If it is discriminated that the temperature has been changed, the changed current temperature is substituted for linear Equations of Formulae 4 and 5 to calculate a gradient and a y-intercept of the laser power voltage outputted by the laser diode from the changed current temperature (S504), and to complete Formula 6 according to the changed temperature (S506).

Furthermore, the input current (IX) for outputting the desired laser power voltage (VX) is calculated using Formula 6 according to the changed temperature (S508) and is supplied to the laser diode to allow the laser power desired by the laser diode to be outputted (S510).

As described above, according to the present invention, whether temperature changes have occurred can be detected even in the course of the laser diode being driven, and a linear Equation of the laser power voltage relative to the input current from the changed current temperature if there has occurred a temperature change is re-calculated to determine the input current which is supplied to the laser diode. Consequently, temperature change can be compensated even in the course of recording a predetermined data on an optical disk and reproducing the data from the disk such that the laser power desired by the laser diode can be accurately outputted.

The above explanation was given on the assumption that the gradient has a linear relation between a1 and a2 relative to the temperature change, and the y-intercept has a linear relation between b1 and b2 relative to the temperature change.

However, characteristics of the gradient and the y-intercept of the laser power voltage relative to the temperature change cannot accurately form a linear relation, but are changed non-linearly.

It is therefore imperative in the present invention that the non-linearly changed gradient and y-intercept be linearly converted and stored in an optical storage apparatus.

For this, a temperature was arbitrarily changed within a temperature range between the minimum temperature Temp1 and the maximum temperature Temp2 of the laser diode, and a laser power voltage outputted by the laser diode in response to the input current was measured. Gradients and y-intercepts of the laser power voltage thus measured are detected to obtain a non-linear graph as shown in dotted lines of FIGS. 6 and 7. Preferably, the gradients and the y-intercepts of the laser power voltages are measured from at least 20 or more mutually different detected temperatures.

The measured gradients and y-intercepts of the non-linear graph were linearly interpolated by use of linear interpolation method. The linear interpolation uses, for example, one of many linear interpolation methods including Lagrange method, Least Mean Square Method and Newton's Method.

Figure 6:
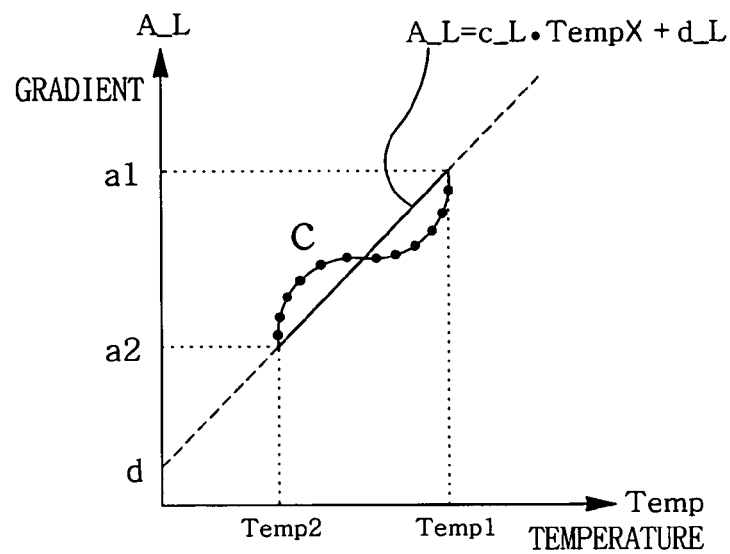
FIG. 6 is a graph explaining an operation of performing a linear interpolation of a gradient characteristic of laser power voltage-temperature according to another embodiment of a temperature compensating method according to the present invention.
Figure 7:
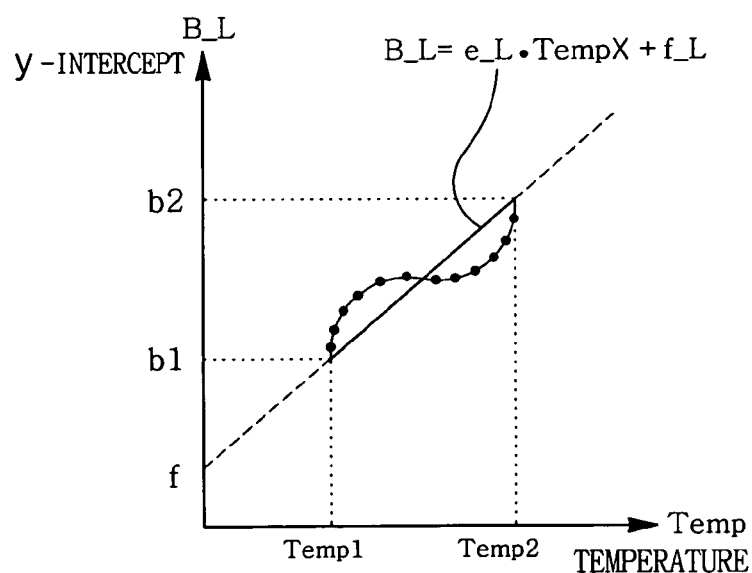
FIG. 7 is a graph explaining an operation of performing a linear interpolation of a y-intercept of laser power voltage-temperature according to another embodiment of a temperature compensating method according to the present invention.
Figure 8:
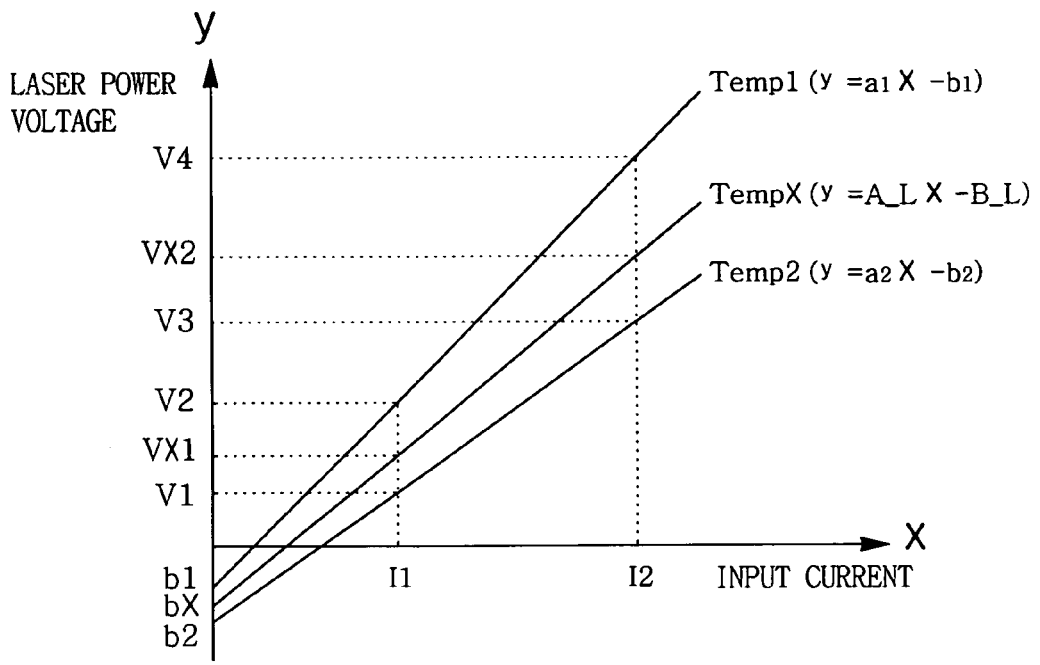
FIG. 8 is a graph illustrating an operation of another embodiment of the present invention.

The following linear Equations of Formulae 7 and 8 are obtained relative to the linearly interpolated gradients and y-intercepts of temperature-laser power voltage.

$$A\_L = c\_L \cdot TempX + d\_L,\qquad \text{Formula 7}$$

where c_L and d_L are a gradient and a y-intercept in the linearly interpolated graph of FIG. 6.

$$B\_L = e\_L \cdot TempX + f\_L,\qquad \text{Formula 8}$$

where e_L and f_L respectively denote a gradient and a y-intercept in the linearly interpolated graph of FIG. 7.

The Formulae 7 and 8 thus obtained are stored in advance on an optical storage apparatus.

If a laser diode is driven, a current temperature is detected by a temperature sensor as depicted in FIG. 5, and the detected current temperature is substituted for Formulae 6 and 7 to obtain a linearly interpolated gradient and y-intercept. The obtained gradient and y-intercept are substituted for Formula 1, and for example, Formula 8 which is a relation of Equation of input current-laser power voltage relative to the current temperature TempX is completed as shown in FIG. 9.

$$Y = A\_Lx - B\_L \cdot TempX\qquad \text{Formula 9}$$

If Formula 9 is completed, an input current of the laser power voltage outputted by the laser diode is calculated from the current temperature, and the calculated input current is supplied to the laser diode to prompt a desired laser power to be outputted.

Figure 9:
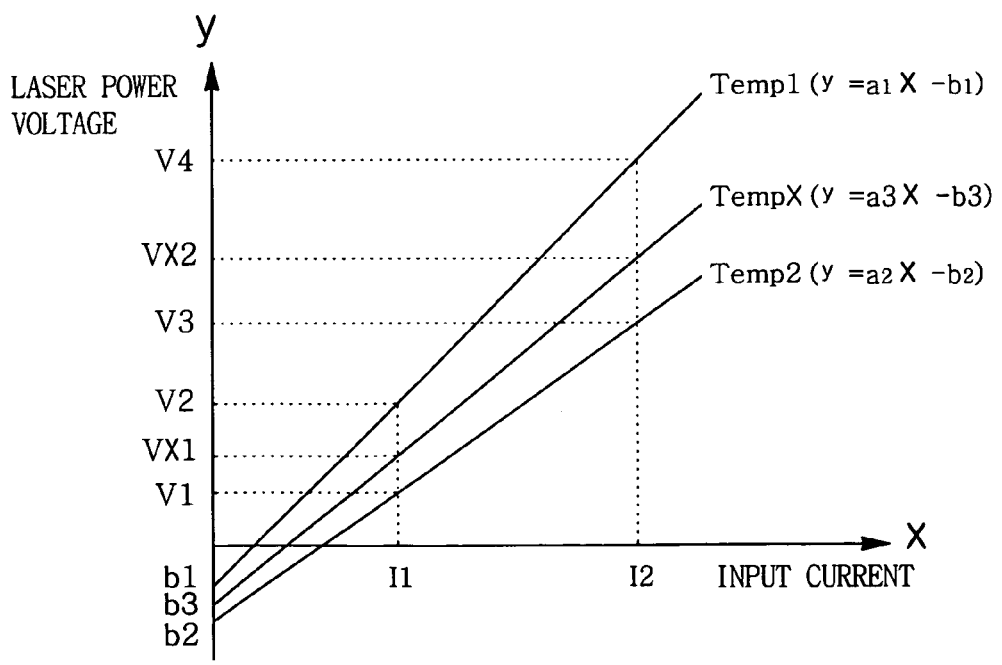
FIG. 9 is a graph illustrating an operation of still another embodiment of a temperature compensating method according to the present invention.

FIG. 9 is a graph illustrating an operation of still another embodiment of a temperature compensating method according to the present invention.

Referring to FIG. 9, arbitrary input currents I1 and I2 are supplied to a laser diode from a current temperature at the start of operating the laser diode. If the arbitrary input currents I1 and I2 are to be supplied, laser power voltages VX1 and VX2 outputted by the laser diode are respectively detected.

If the laser power voltages VX1 and VX2 are detected, the input currents I1 and I2 and the detected laser power voltages VX1 and VX2 are substituted for Formula 1 to obtain Formulae 10 and 11.

$$VX1 = aI1 - b\qquad \text{Formula 10}$$

$$VX2 = aI2 - b,\qquad \text{Formula 11}$$

where the input currents I1 and I2 and the laser power voltages VX1 and VX2 are already known values, and a gradient and a y-intercept are obtained using Formulae 10 and 11. The obtained gradient and y-intercept are substituted for Formula 1 to complete Formula 11 which is a linear Equation of the laser power voltage relative to the input current value under a current temperature.

$$y = a3x - b3,\qquad \text{Formula 12}$$

where a3 denotes a gradient of $a2 \leq a3 \leq a1$, and b3 is a y-intercept of $b1 \leq b3 \leq b2$.

If a linear Equation of the laser power voltage relative to the input current value is completed under the current temperature, an optical storage apparatus discriminates a necessary laser power voltage, and an input current for creating the discriminated laser power voltage is calculated by Formula 12. The calculated input current is supplied to the laser diode to allow a desired laser power to be outputted.

Figure 10:
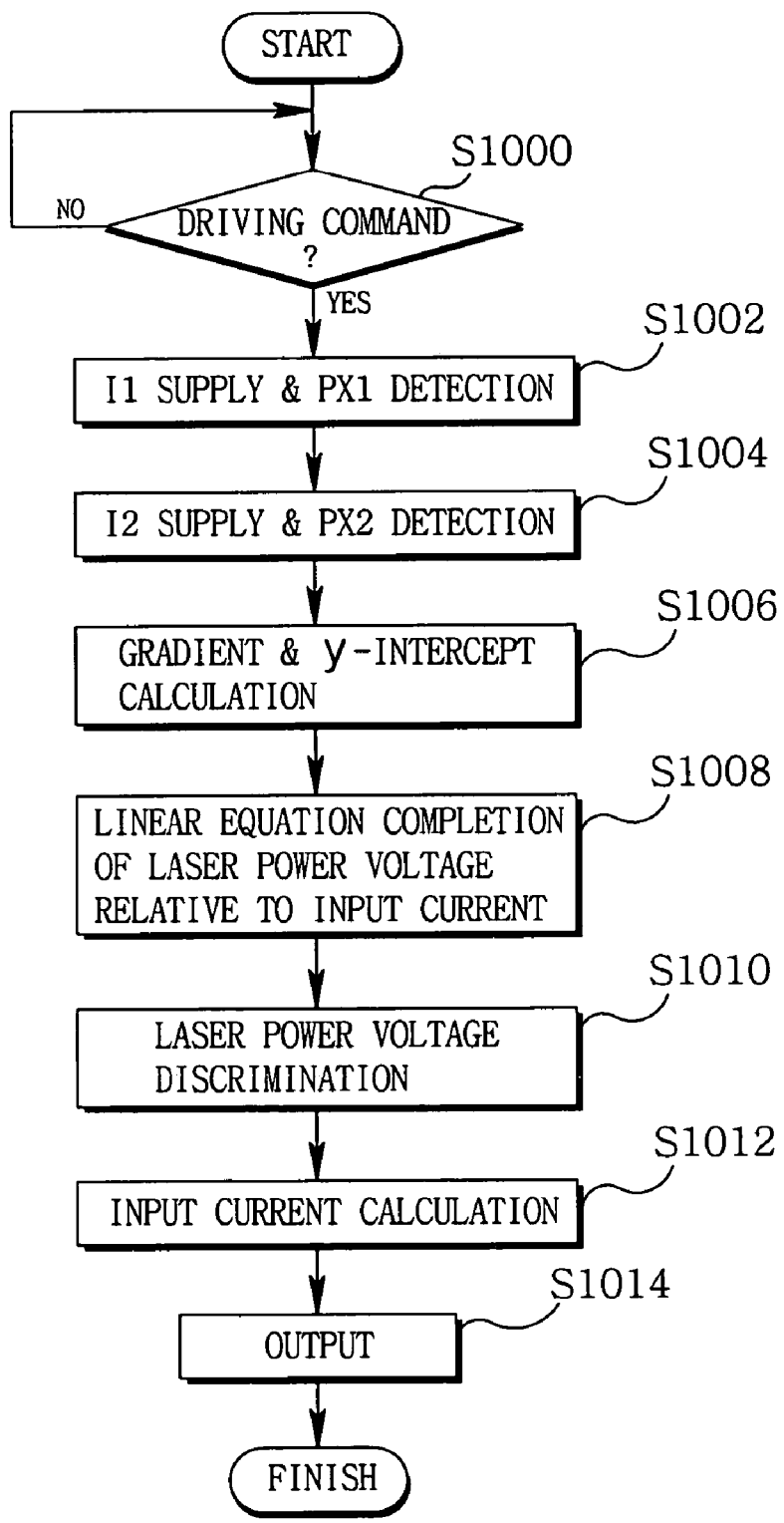
FIG. 10 is a signal flowchart illustrating an operation of still another embodiment of a temperature compensating method according to the present invention.

FIG. 10 is a signal flowchart illustrating an operation of still another embodiment of a temperature compensating method according to the present invention.

As illustrated in FIG. 10, an optical storage apparatus discriminates whether a driving command of the laser diode has been inputted (S1000). The input of the driving command of the laser diode can be discriminated by whether a recording command or a reproduction command of the optical disk has been inputted.

If the driving command of the laser diode has been inputted, the optical storage apparatus supplies the input current I1 to the laser diode to detect the laser power voltage VX1 outputted from the laser diode (S1002). The optical storage apparatus then supplies the input current I2 to the laser diode to detect the laser power voltage VX2 outputted from the laser diode (S1004).

If the laser power voltages VX1 and VX2 are detected, the input currents I1 and I2, and the laser power voltages VX1 and VX2 are respectively substituted for x value and y value of Formula 1 to obtain two Formulae, and a gradient and a y-intercept are obtained using the obtained two Formulae (S1006).

The obtained gradient and the y-intercept are substituted for Formula 1 to complete Formula 11 which is a linear Equation of the laser power voltage outputted by the laser diode in response to the input current under the current temperature (S1008).

If Formula 11 is completed, the laser power voltage is discriminated according to the inputted driving command (S1010). The laser power voltage is established in advance according to the driving command. For example, a predetermined data is to be recorded on an optical disk, the laser power voltage is established at a high level, and if a predetermined data stored in an optical disk is to be reproduced, a lower level of laser power voltage is established than that of the recording. The optical storage apparatus discriminates an operation according to the inputted driving command, and again discriminates the laser power voltage for performing the discriminated operation.

Furthermore, the discriminated laser power voltage is substituted for Formula 11 to calculate an input current of the laser diode (S1012), where the calculated input current is supplied to the laser diode to allow a laser power voltage desired by the laser diode to be outputted (S1014).

According to the present invention thus mentioned, a linear Equation of a laser power voltage outputted by a laser diode in response to temperature changes is obtained, and an input current is calculated by the linear Equation, which is supplied to a laser diode.

As a result, an accurate input current can be calculated and supplied so that a laser power desired by a laser diode can be outputted to conform to the temperature changes in driving the laser diode.

Furthermore, in one and the other embodiment of the present invention, an input current can be re-calculated and supplied to a laser diode even if a temperature is changed when a predetermined data is recorded on or reproduced from an optical disk. Consequently, even if the temperature is changed in the course of the predetermined data being recorded on or reproduced from the optical disk, the laser diode can output a constant laser power, thereby enabling to perform stable recording and reproducing operations.

Even during the occurrence of buffer under-run where a recording operation is temporarily stopped in the course of recording a predetermined data on an optical disk and the recording operation is again performed, the laser diode can calculate an input current for outputting a same laser power as before and supply it. Therefore, deterioration of recording quality caused by temperature changes can be avoided in advance to enable to guarantee certified recording and reproducing performances.

While the invention has been described by way of example and in terms of preferred embodiments, it will now be readily possible for those skilled in the art to put this invention into various other manners. It is also to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A temperature compensating method of laser power in an optical disk storage apparatus comprising:
   detecting a laser power voltage relative to the input current under mutually different plural temperatures between a maximum temperature and a minimum temperature;
   obtaining an Equation of input current under each temperature-laser power voltage by way of the laser power voltage thus detected relative to the input current;
   calculating plural gradients and a y-intercept;
   performing a linear interpolation of the thus-calculated plural gradients and the y-intercept;
   obtaining the linear Equation of the gradient of laser power voltage-temperature and the linear Equation of y-intercept of the laser power voltage-temperature by way of the linearly interpolated plural gradients thus calculated and the y-intercept;
   detecting whether a driving command of the laser diode is inputted;
   when the driving command of the laser diode is detected,
      detecting a current temperature, and substituting the current temperature for the linear Equation of the gradient of the laser power voltage against the temperature and for the linear Equation of y-intercept of laser power voltage against the temperature to obtain a gradient of laser power voltage of the current temperature and the y-intercept;
      substituting the gradient of the laser power voltage of the current temperature and the y-intercept for a linear Equation to obtain a linear Equation of the laser power voltage-input current;
      calculating an input current of the laser diode outputting a predetermined laser power voltage corresponding to the driving command by the linear Equation of the laser power voltage-input current; and
      supplying the input current to drive the laser diode;
   when the driving command of the laser diode is not detected,
      detecting whether the laser diode is driven;
      when the laser diode is driven, detecting the current temperature, and comparing the current temperature and a previous detected temperature to determine whether there is a temperature change; and
      when the temperature change is determined,
         substituting the gradient of the laser power voltage of the current temperature and the y-intercept of the current temperature to obtain a new linear Equation of the laser power voltage-input current; and
         re-calculating a new input current of the laser diode using the new linear Equation of the laser power voltage-input current; and
         supplying the re-calculated new input current to drive the laser diode such that the laser power of the laser diode due to the temperature change is compensated,
   wherein the linear Equation of the laser power voltage-input current is y=ax+b, where 'y' denotes a laser power voltage, 'a' denotes a gradient, 'x' denotes an input current and 'b' denotes a v-intercept.

2. The method as defined in claim 1, wherein the driving command of the laser diode is a recording command or a reproduction command of the optical disk.

3. The method as defined in claim 1, wherein the linear interpolation of the gradient and the y-intercept is performed by one of Lagrange method, Least Mean Square Method and Newton's Method.

* * * * *